(12) United States Patent
Erickson

(10) Patent No.: US 6,239,629 B1
(45) Date of Patent: May 29, 2001

(54) SIGNAL COMPARISON SYSTEM AND METHOD FOR DETECTING AND CORRECTING TIMING ERRORS

(75) Inventor: Bruce A Erickson, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/302,688

(22) Filed: Apr. 29, 1999

(51) Int. Cl.[7] .......................................... H03L 7/00
(52) U.S. Cl. ............................. 327/141; 326/93; 713/401
(58) Field of Search .................................. 327/141, 144, 327/146, 165; 375/359, 371; 713/401, 503

(56) References Cited

U.S. PATENT DOCUMENTS

| | | | |
|---|---|---|---|
| 4,975,605 | * 12/1990 | Bazes | 327/161 |
| 5,229,668 | 7/1993 | Huges, Jr. et al. | 307/605 |
| 5,467,464 | 11/1995 | Oprescu et al. | 395/550 |
| 5,504,751 | * 4/1996 | Ledzius et al. | 341/144 |
| 5,671,258 | * 9/1997 | Burns et al. | 375/359 |
| 5,692,165 | 11/1997 | Jeddeloh et al. | 395/551 |
| 5,828,243 | * 10/1998 | Bagley | 327/99 |
| 5,886,552 | * 3/1999 | Chai et al. | 327/165 |
| 5,910,742 | * 6/1999 | Synder et al. | 327/165 |
| 5,933,623 | 8/1999 | Umemura et al. | 395/551 |
| 6,041,089 | * 3/2000 | Yokomizo | 375/371 |
| 6,108,794 | 8/2000 | Erickson | 713/401 |
| 6,137,851 | * 10/2000 | Erickson et al. | 375/372 |

* cited by examiner

*Primary Examiner*—Michael Tokar
*Assistant Examiner*—Steven S. Paik

(57) ABSTRACT

A signal comparison system determines whether a data signal is transitioning close to transitions of its clock signal, thereby causing possible errors in the sampling of the data signal. The signal comparison system includes a plurality of latches that receive a first signal and a second signal and that transmit a respective value of the first signal in response to a transition of the second signal. Delay mechanisms delay the transition of the second signal before the transition is received by latches so that the transition is delayed different amounts relative to each of the latches. A feedback mechanism receives the values transmitted by the latches and determines whether these values are logically equivalent. The feedback mechanism then transmits a feedback signal in response to a determination that one of the values is logically different than another of the values.

19 Claims, 11 Drawing Sheets

SIGNAL COMPARISON SYSTEM AND METHOD FOR DETECTING AND CORRECTING TIMING ERRORS

FIELD OF THE INVENTION

The present invention generally relates to computer systems and, in particular, to a signal comparison system and method for improving data analysis by analyzing transitions of a data signal with respect to transitions of a clock signal and by adjusting the timing of the data signal and/or clock signal transitions to correct for timing errors.

BACKGROUND OF THE INVENTION

As known in the art, data within a computer system is typically sampled with respect to a system clock signal. For example, a data signal may be sampled at the occurrence of every rising edge and/or falling edge of a clock signal. When the data signal is synchronized with respect to the clock signal, the clock signal is designed to produce one sample for each bit of the data signal (e.g., a clocking edge of the clock signal occurs once for every bit of the data signal). Accordingly, each bit of the data signal is reliably sampled and used by the computer system to perform various functionality.

Ideally, transitions of the clock signal do not occur close to transitions of the data signal. If a data signal transitions too close to the occurrence of a clock transition, then the data may be in a transition state when the data signal is sampled, thereby causing the data to be unreliable. Furthermore, small timing variations can cause the clock transition to actually skip a bit of data and to prematurely sample the next bit of data. Therefore, great care is usually taken to keep transitions of clock signals sufficiently separated from transitions of data signals in order to ensure data reliability.

Unfortunately, sufficient separation of data signal transitions and clock signal transitions cannot always be ensured. Errors in generating data signals and clock signals as well as delays in processing data signals and clock signals cause the transitions of the two signals to fluctuate with respect to one another such that data signal transitions may occur too close to clock signal transitions to ensure reliable data. Therefore, there exists a need for a system or method for determining when data signal transitions occur with respect to clock signal transitions and for adjusting the transitions of the data or clock signal when the transitions of the two signals are too close. This is especially true in systems that receive data signals and clock signals from external sources such as logic analyzers, for example.

Logic analyzers analyze data generated within an external computer system or other digital system in order to determine errors within the data. Therefore, logic analyzers receive data from the system under analysis and sample the data relative to an external clock signal also received from the system. It is desirable for the logic analyzer to ensure that transitions of the received clock signal are not occurring too close to transitions of the received data signal. Otherwise, timing errors could occur that corrupt the analysis of the data.

Many prior art systems test for adequate separation of data signal transitions and clock signal transitions by having the system under analysis transmit a predetermined data signal for calibration. In this regard, the sampled data is compared to the predetermined data to determine whether the two match. If the two data signals match, then it is assumed that there is adequate separation of the transitions of the data and clock signals. However, if the two data signals do not match, then the timing of the two signals is adjusted, and the data is then retested. This process is continued until the two signals match.

Not only does this prior art method take time to establish an accurate result, but the system under analysis must be able to generate a "known-good" signal. Furthermore., the timing of the clock signal transitions with respect to the data signal transitions is not actually determined, making it difficult to isolate the source and amount of error when the two data signals do not match.

Thus, a heretofore unaddressed need exists in the industry for providing a signal comparing system and method for determining transitions of a data signal relative to transitions of a clock signal and for adjusting the timing of the transitions to prevent timing errors.

SUMMARY OF THE INVENTION

The present invention overcomes the inadequacies and deficiencies of the prior art as discussed herein. The present invention provides a system and method for improving data communications by determining when transitions of a first signal occur with respect to transitions of a second signal and by adjusting, when appropriate, the transitions of the two signals.

The present invention utilizes a first latch, a second latch, a third latch, a first delay mechanism, a second delay mechanism, and a feedback mechanism. Each of the latches receives a first signal and a second signal and transmits a respective value of the first signal in response to a transition of the second signal. The first delay mechanism delays the transition of the second signal before the transition is received by the first latch, and the second delay mechanism delays the transition of the second signal before the transition is received by the second latch. The feedback mechanism receives the values transmitted by the latches and determines whether these values are logically equivalent. The feedback mechanism then transmits a feedback signal in response to a determination that one of the values is logically different than another of the values.

In accordance with another feature of the present invention, a third delay mechanism delays the first signal and adjusts the delay of the first signal based on the feedback signal transmitted by the feedback mechanism.

In accordance with another feature of the present invention, an enabling mechanism transmits an enabling signal to the third delay mechanism after the transition of the second signal has been received by each of the latches and before the next transition of the clock signal is received by any of the latches.

The present invention can also be viewed as providing a method for correcting timing errors. Briefly described, the method can be broadly conceptualized by the following steps: receiving a first signal and a second signal; latching a value of the first signal in response to a transition of the second signal; latching another value of the first signal in response to the transition of the second signal; delaying the transition prior to one of the latching steps; comparing the values; transmitting a feedback signal based on the values; and adjusting a delay of the first signal based on the feedback signal.

Other features and advantages of the present invention will become apparent to one skilled in the art upon examination of the following drawings in the detailed description. It is intended that all such features and advantages be included herein within the scope of the present invention and protected by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE PREFERRED EMBODIMENT

Figure 1A:
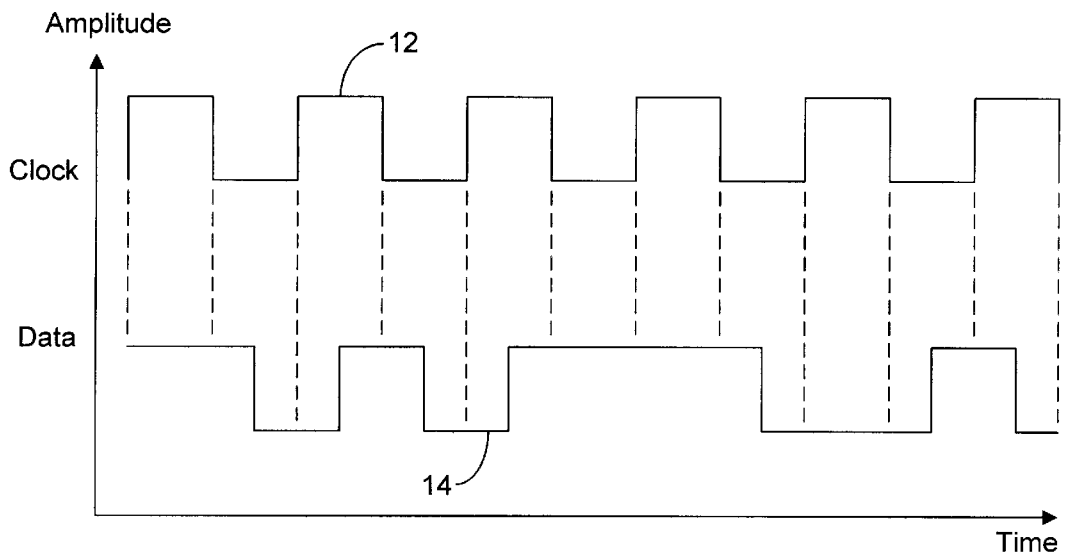
FIG. 1A is an illustrative diagram illustrating the timing relationship of a data signal with a clock signal, when the timing of the data signal and the clock signal is properly aligned.
Figure 1B:
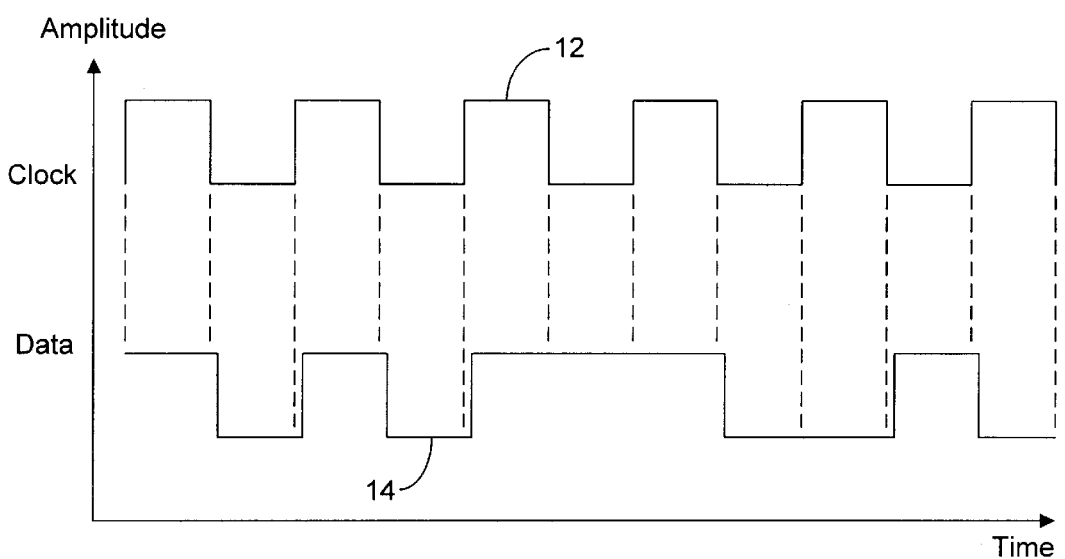
FIG. 1B is an illustrative diagram illustrating the timing relationship of the data signal with the clock signal of FIG. 1A, when transitions of the data signal occur close to transitions of the clock signal.

FIGS. 1A and 1B illustrate examples of the transitions of a clock signal 12 with respect to transitions of a corresponding data signal 14. FIG. 1A depicts an ideal situation where transitions of the clock signal 12 and the data signal 14 occur far enough apart to ensure accurate sampling. In FIGS. 1A and 1B, assume, for illustrative purposes only, that the data signal 14 contains eleven bits of information. Therefore, the data signal 14 contains two bits of information for each period of clock signal 12, and the data signal 14 is sampled for each transition of clock signal 12 (i.e., the data signal 14 is sampled on every rising and falling edge of clock signal 12). As clearly illustrated by the dashed reference lines in FIG. 1A, each transition of the clock signal 12 occurs approximately in the middle of each data bit of data signal 14. Having the clock signal 12 transition in the middle of each data signal 14 bit is an ideal situation because each data bit center is stable and any small variations in timing are likely to produce very few, if any, errors.

Contrasting FIG. 1A is FIG. 1B, which depicts the same clock signal 12 and data signal 14 when the transitioning of the two signals occur too close to one another to ensure reliable sampling. As illustrated by the dashed reference lines in FIG. 1B, the transitions of clock signal 12 occur very close to the transitions of the data signal 14. Consequently, a small variation in timing of either the clock signal 12 or the data signal 14 could cause a transition of the clock signal 12 to occur during the wrong data signal bit, thereby causing a sampling of an incorrect data value. Furthermore, as known in the art, there exists a finite amount of transition time for a bit to switch from one state to another (e.g., to switch from a low value to a high value or vice versa). Therefore, by having the transitions of the clock signal 12 occur close to the transitions of the data signal 14, it is possible for the data signal 14 to be sampled during a transition state which yields unreliable results. Accordingly, it is desirable to detect and prevent the transitions of clock signal 12 from occurring close to the transitions of the data signal 14.

In general, the present invention provides a signal comparison system and method for improving data analysis by ensuring adequate separation of the transitions of the clock signal 12 from the transitions of the data signal 14. In the preferred embodiment, as illustrated by way of example in FIG. 2, the signal comparison system 20 of the present invention along with its associated methodology is implemented within a computer system 23. Furthermore, computer system 23 is preferably a logic analyzer. As noted in the Background section hereinabove, the signal comparison system 20 is particularly useful in a logic analyzer since logic analyzers typically evaluate an external data signal 14 (FIGS. 1A and 1B) in relation to an external clock signal 12 (FIGS. 1A and 1B). However, the principles of the present invention are not limited for use in logic analyzers and may be implemented in any system 23 where it is desirable to detect and adjust transitions of one signal relative to transitions of another signal.

Furthermore, control logic 24 for controlling the features of the signal comparison system 20 can be stored in computer memory 25 of the computer system 23. Note that control logic 25 can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory. As an example, the control logic 24 may be magnetically stored and transported on a conventional portable computer diskette.

Figure 2:
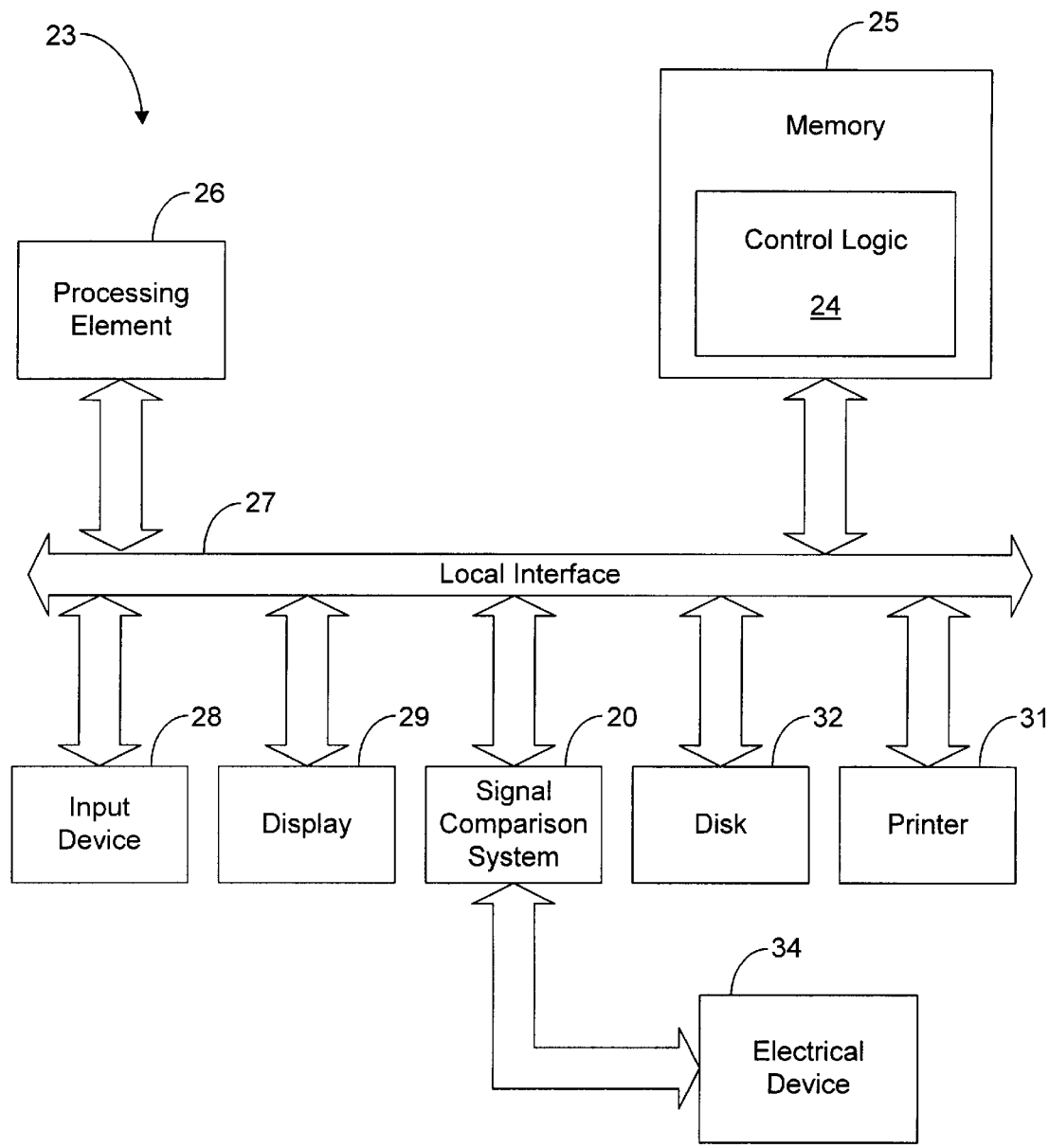
FIG. 2 is a block diagram illustrating a computer system employing a signal comparison system in accordance with the principles of the present invention.

The preferred embodiment of the computer system 23 of FIG. 2 comprises one or more conventional processing elements 26, such as a digital signal processor (DSP), that communicate to and drive the other elements within the system 23 via a local interface 27, which can include one or more buses. Furthermore, an input device 28, for example, a keyboard or a mouse, can be used to input data from a user of the system 23, and screen display 29 or a printer 31 can be used to output data to the user. A disk storage mechanism 32 can be connected to the local interface 27 to transfer data to and from a nonvolatile disk (e.g., magnetic, optical, etc.). The signal comparison system 20 can be connected to an electrical device 34, such as another computer system, for example, which is detachable from system 23. In the preferred embodiment, the system 20 receives the signals 12 and 14 from device 34, although the system 20 can receive the signals 12 and 14 from other devices, which can be located internally or externally to system 23.

Figure 3:
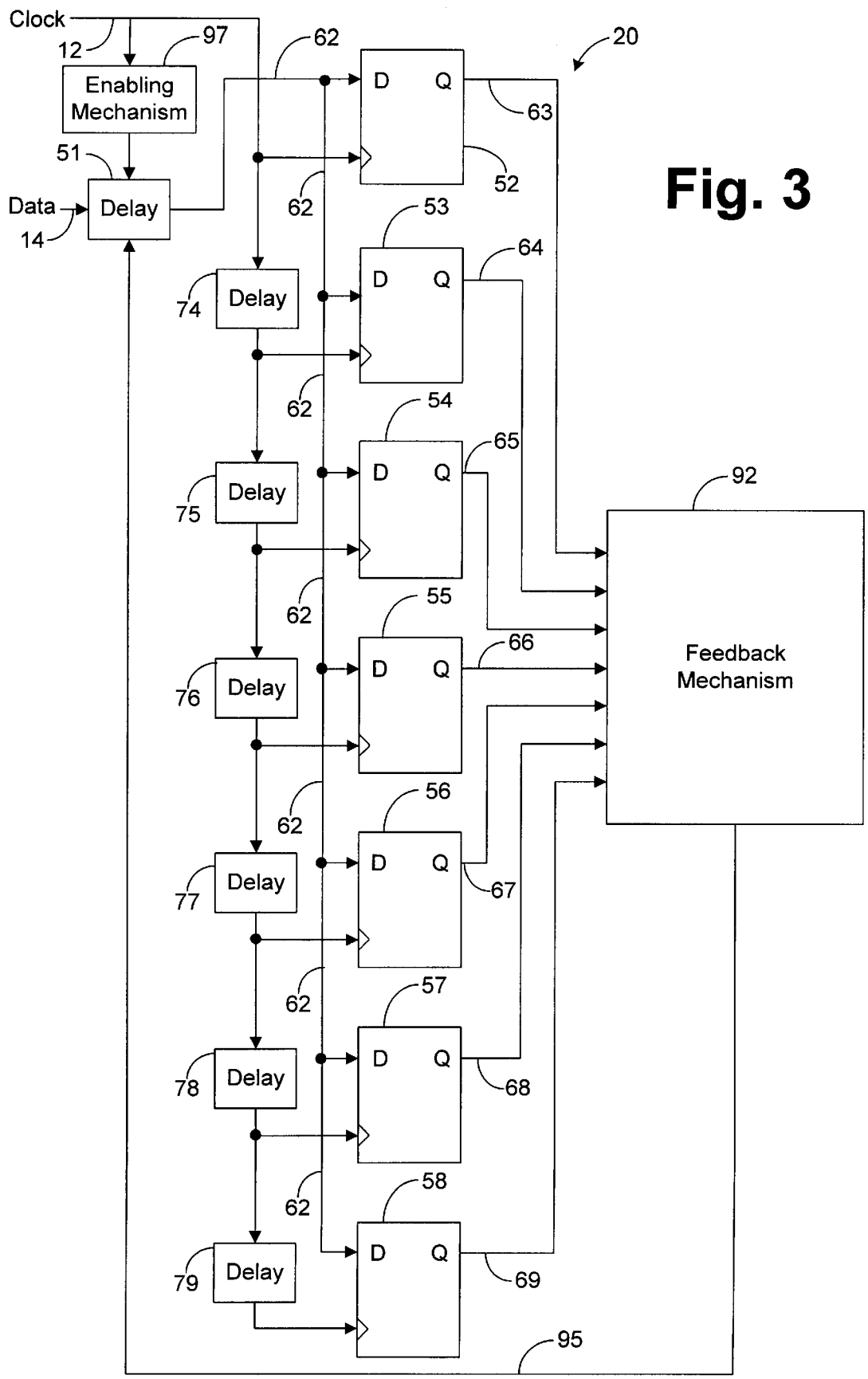
FIG. 3 is a block diagram illustrating an implementation of the signal comparison system of FIG. 2.

FIG. 3 depicts the preferred embodiment of the signal comparison system 20 of the present invention. As shown by FIG. 3, the data signal 14 is input into a delay mechanism 51, which transmits the data signal 14 to a plurality of latches 52–58 via connection 62 after delaying the data signal. The amount of delay associated with the delay mechanism 51 will be discussed in further detail hereinafter.

The plurality of latches 52–58 receive the data signal on connection 62 as a data (D) input and receive the clock signal 12 as a clock input. Latches 52–58 can be of any conventional design and, in the preferred embodiment, are conventional flip-flops of any suitable type or model. Each latch 52–58 is configured to transmit as an output (Q) the value of the data signal being received as an input (D) when a transition of the clock signal 12 is detected by the latch 52–58. Therefore, the values transmitted by the latches 52–58 on connections 63–69 are sampled data values of the data signal on connection 62.

In the preferred embodiment, the output (Q) of latch 55 is used by components or devices outside of the system 20 for various functionality. For example, other components of the system 23 preferably utilize the output (Q) from latch 55 as the sampled data signal 14 in analyzing or processing the logic of the data signal 14. Therefore, connection 66 is coupled to other components of the system 23 (FIG. 2) that analyze and/or process the signals on connection 66. Consequently, it is important to ensure the reliability of the data on connection 66.

Delay mechanisms 74–79 are configured to delay the clock signal 12 a predetermined amount as the clock signal 12 passes through the delay mechanisms 74–79. In this regard, the clock signal 12 is: (1) delayed by delay mechanism 74 before being transmitted to latch 53, (2) delayed by delay mechanisms 74 and 75 before being transmitted to latch 54, (3) delayed by delay mechanisms 74–76 before being transmitted to latch 55, (4) delayed by delay mechanisms 74–77 before being transmitted to latch 56, (5) delayed by delay mechanisms 74–78 before being transmitted to latch 57, and (6) delayed by delay mechanisms 74–79 before being transmitted to latch 58.

The amount of delay associated with each delay mechanism 74–79 may vary. In the preferred embodiment, it is desirable for the sum of the delays associated with each delay mechanism 74–79 to be less than the setup/hold time associated with the data signal 14 in order to facilitate and optimize the testing of the data signal 14. However, in an alternative embodiment, it may be desirable for the sum of the delays associated with each delay mechanism 74–79 to be greater than the setup/hold time associated with the data signal 14 in order to optimally find transitions of the data signal 14.

Furthermore, although not necessary in implementing the present invention, the delay associated with each delay mechanism 74–79 is the same in the preferred embodiment. For example, assume that it is desirable to ensure the reliability of the data values transmitted across connection 66 by ensuring that any transition of the data signal 14 being input to the latch 55 does not occur within 150 pico-seconds (ps) of any transition of the clock signal 12 being input to the latch 55. In the preferred embodiment, the delay associated with each delay mechanism 74–79 is, therefore, 50 ps (i.e., 2(150)/(n−1), where n is the total number of latches 52–58).

Consequently, the clock signal 12 received by latches 53–58 is respectively delayed 50, 100, 150, 200, 250, and 300 ps by delay mechanisms 74–79. Therefore, latches 52–54 respectively receive a clock signal transition 150, 100, and 50 ps before the latch 55 receives the transition, and latches 56–58 respectively receive a clock signal transition 50, 100, and 150 ps after the latch 55 receives the transition.

Figure 4A:
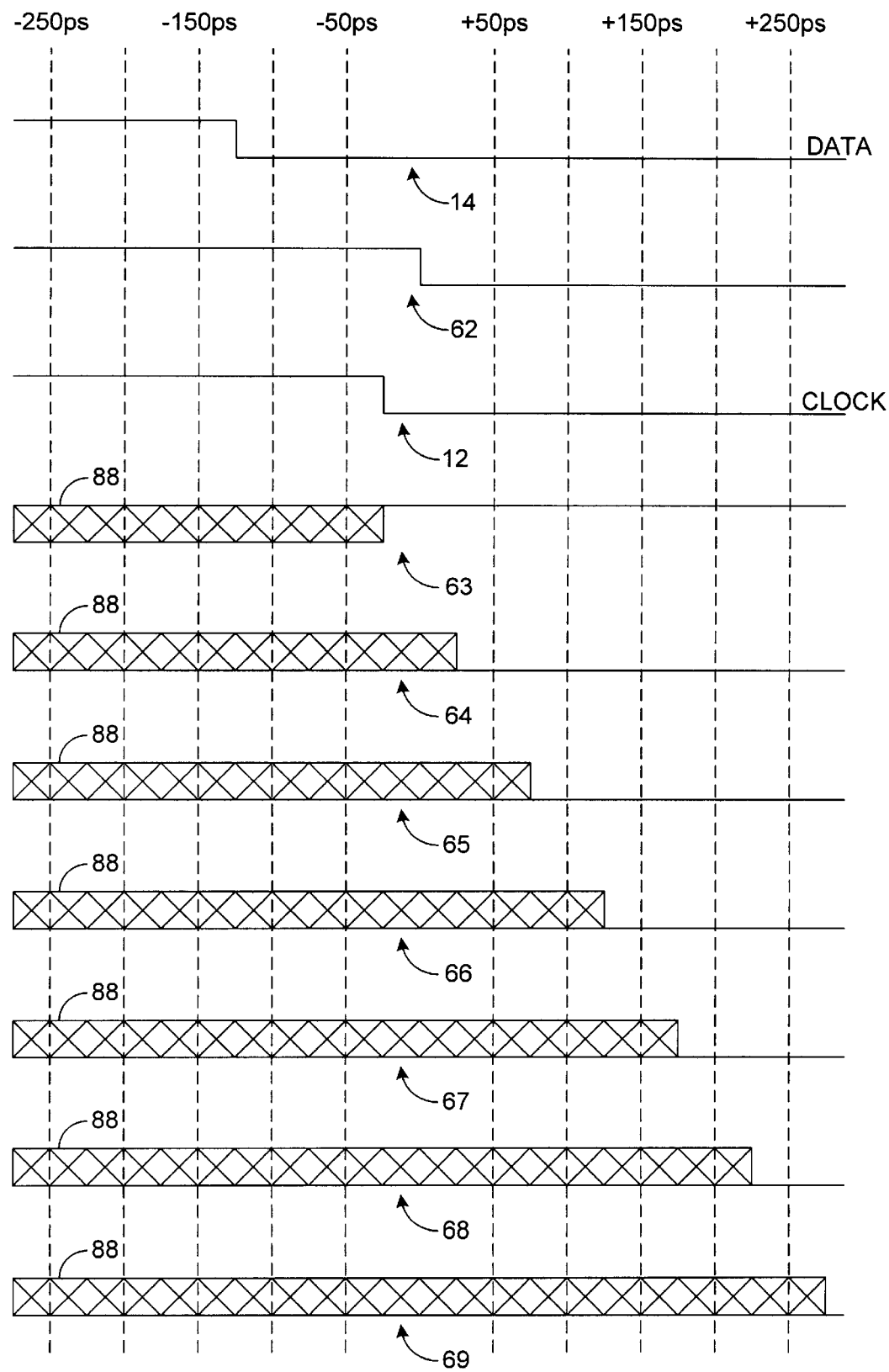
FIGS. 4A–4F are timing diagrams illustrating the values transmitted by the latches of FIG. 3 for various states.

As a result, if a transition of the clock signal 12 is received by latch 55 within 101–150 ps after a corresponding transition of the data signal on connection 62, then the value transmitted on connection 63 by latch 52 should be different than the values transmitted on connections 64–66 by latches 53–55, respectively, once the transition of the clock signal 12 as propagated through each latch 52–55, as shown by FIG. 4A. It should be noted that, in FIGS. 4A–4F, the cross-hatched regions 88 indicate when the values of the connections 63–69 can either be a logical high or a logical low depending on the previous state of the system 20 (i.e., the state of the system before the occurrence of the clock signal 12 shown in FIGS. 4A–4F). In addition, for illustrative purposes, it is assumed that delay mechanism 51 currently delays the data signal 14 by about 125 ps in FIGS. 4A–4F. However, this delay may be varied as will be described in further detail hereinafter.

Figure 4B:
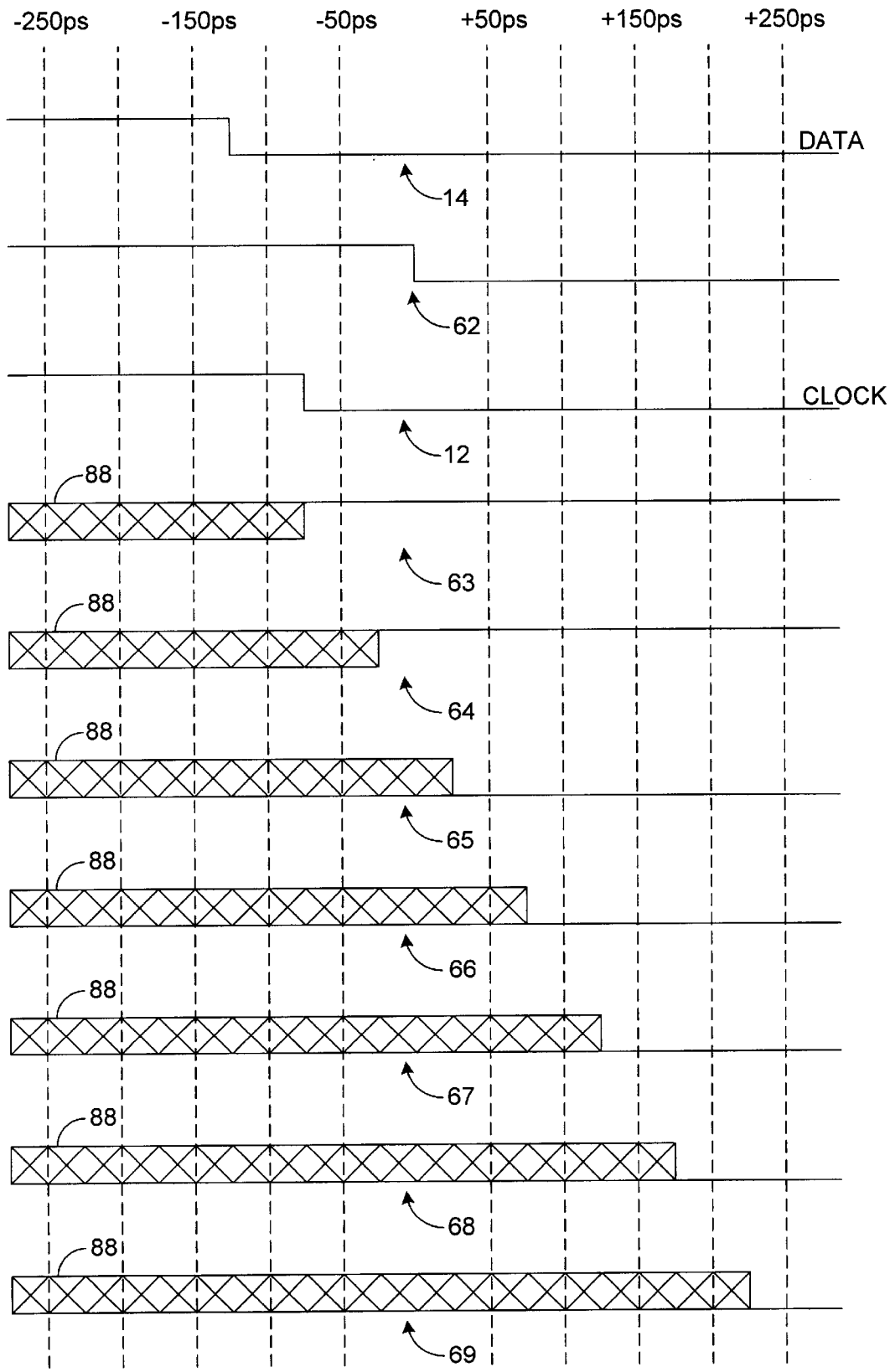
Figure 4C:
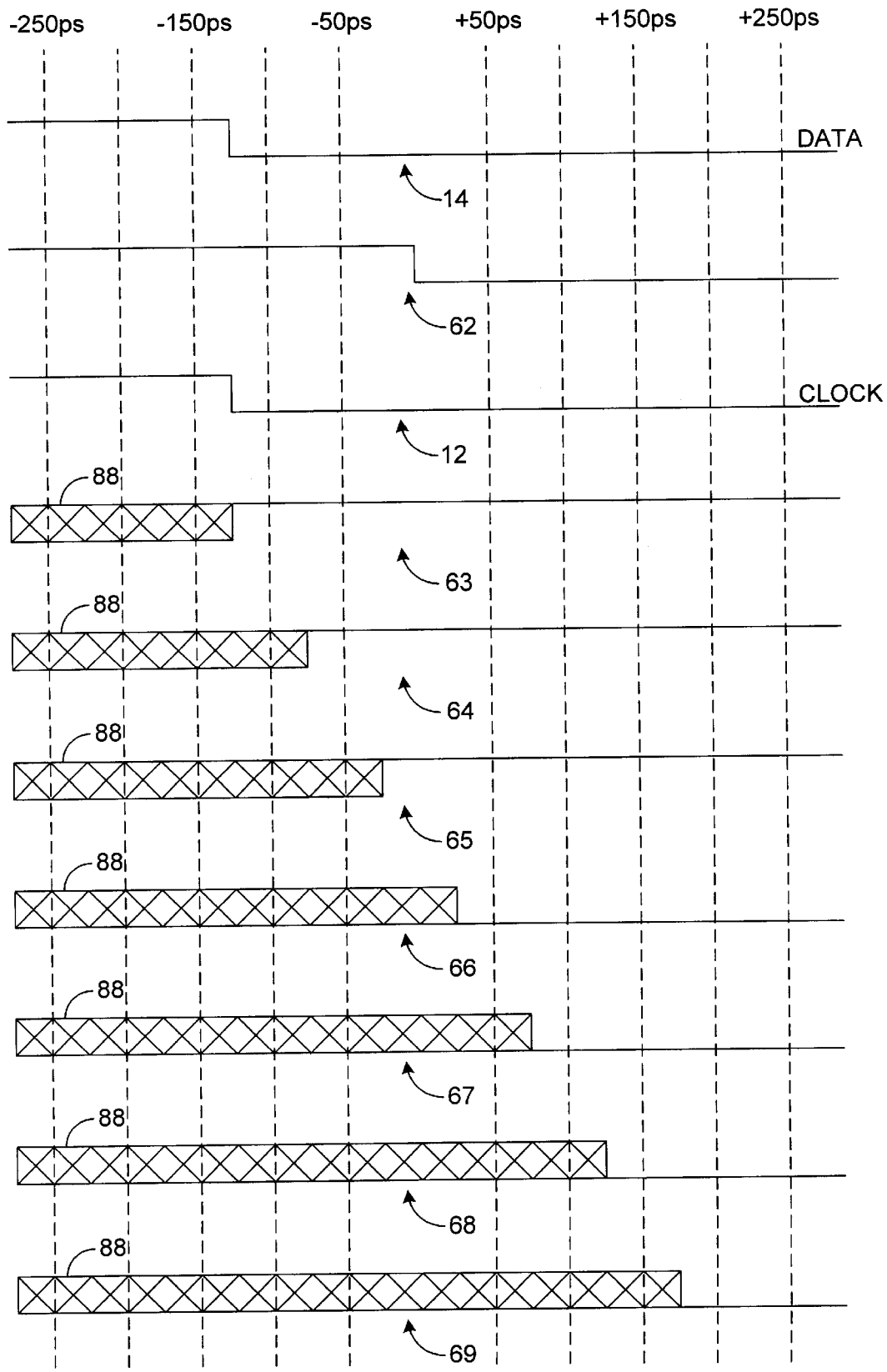

If a transition of the clock signal 12 is received by latch 55 within 51–100 ps after a corresponding transition of the data signal on connection 62, then the values transmitted on connections 63 and 64 by latches 52 and 53, respectively, should be different than the values transmitted on connections 65 and 66 by latches 54 and 55, respectively, once the transition of the clock signal 12 has propagated through each latch 52–55, as shown by FIG. 4B. Furthermore, if a transition of the clock signal 12 is received by latch 55 within 1–50 ps after a corresponding transition of the data signal on connection 62, then the values transmitted on connections 63–65 by latches 52–54, respectively, should be different than the value transmitted on connection 66 by latch 55, once the transition of the clock signal 12 has propagated through each latch 52–55, as shown by FIG. 4C.

Figure 4D:
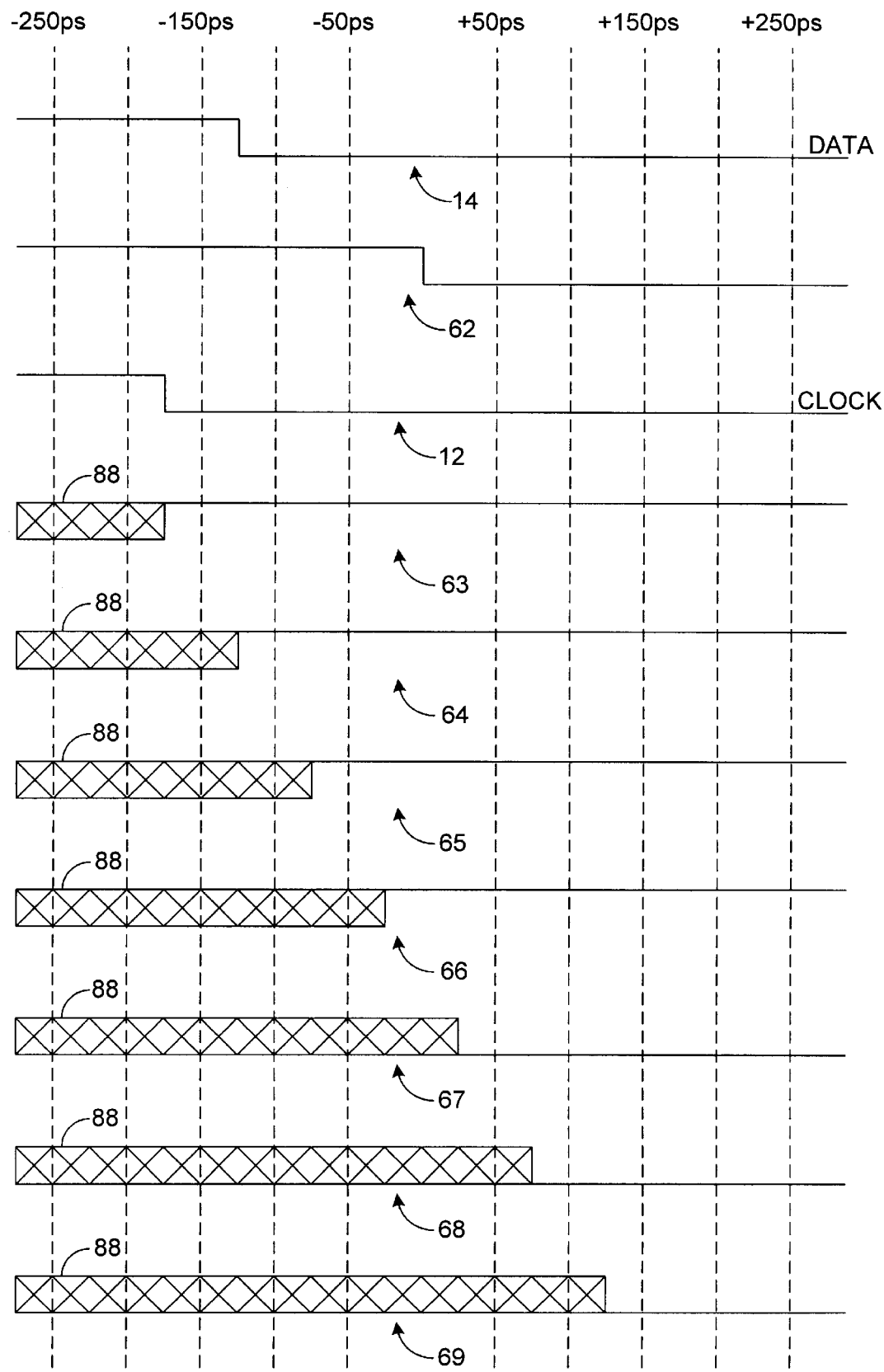
Figure 4E:
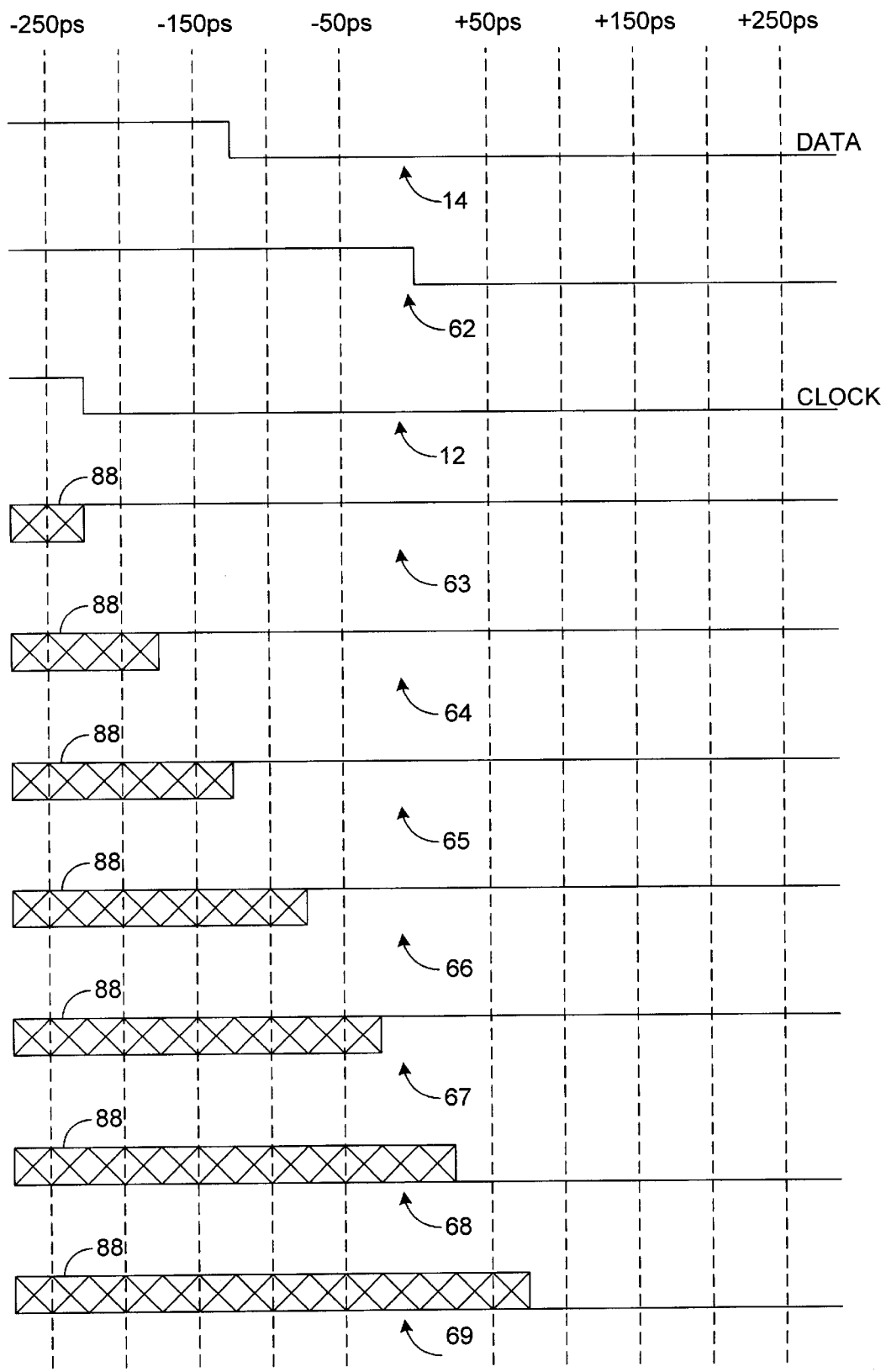
Figure 4F:
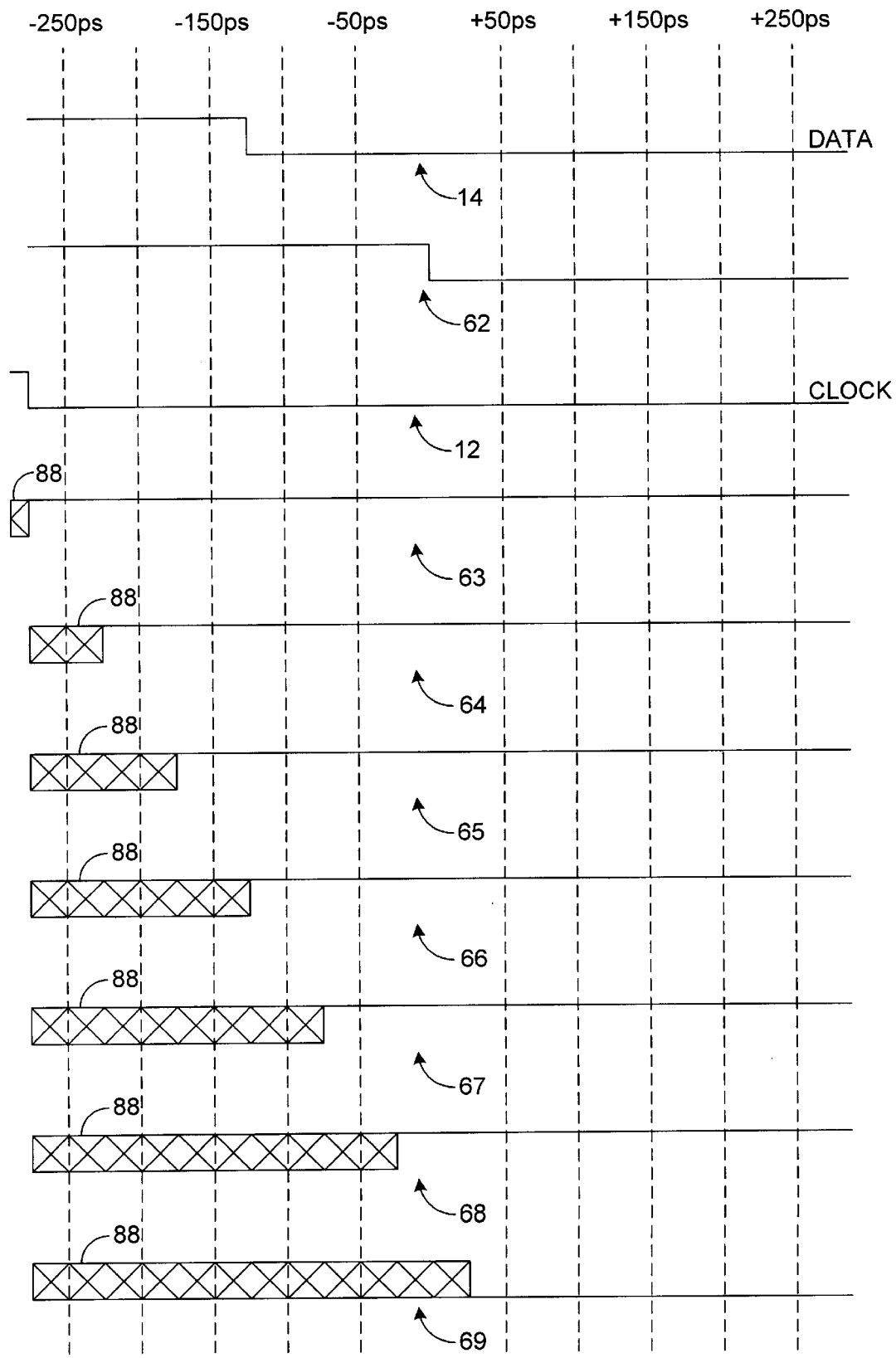

In addition, if a transition of the clock signal 12 is received by latch 55 within 1–50 ps before a corresponding transition of the data signal on connection 62, then the value transmitted on connection 66 by latch 55 should be different than the values transmitted on connections 67–69 by latches 56–58, respectively, once the transition of the clock signal 12 has propagated through each latch 55–58, as shown by FIG. 4D. Furthermore, if a transition of the clock signal 12 is received by latch 55 within 51–100 ps before a corresponding transition of the data signal on connection 62, then the values transmitted on connections 66 and 67 by latches 55 and 56, respectively, should be different than the values transmitted on connections 68 and 69 by latches 57 and 58, respectively, once the transition of the clock signal 12 has propagated through each latch 55–58, as shown by FIG. 4E. If a transition of the clock signal 12 is received by latch 55 within 101–150 ps before a corresponding transition of the data signal on connection 62, then the values transmitted on connection 66–68 by latches 55–57, respectively, should be different than the value transmitted on connection 69 by latch 58, once the transition of the clock signal 12 has propagated through each latch 55–58, as shown by FIG. 4F. Finally, if a transition of the clock signal 12 is received by the latch 55 more than 150 ps before or after a corresponding transition of the data signal on connection 67, then all of the values transmitted on connections 63–69 should be the same, once the transition of the clock signal 12 has propagated through each latch 52–58.

A feedback mechanism 92 is configured to analyze the signals on connections 63–69 to determine whether transitions of the clock signal 12 are occurring within a predetermined time (e.g., 150 ps in the preferred embodiment) of the transitions of the data signal on connection 62. When the values on connections 63–69 are logically different, the feedback mechanism 92 is designed to transmit a feedback signal on connection 95 to delay mechanism 51. In response to the feedback signal, the delay mechanism 51 is designed to change the delay associated with the delay mechanism 51 so that transitions of the data signal on connection 62 are prevented from occurring within a predetermined time (e.g., 150 ps in the preferred embodiment) of the transitions of the clock signal 12 received by the latch 55. Therefore, the value transmitted by the latch 55 on connection 66 should be a reliable sampled value of the data signal 14.

If the value on connection 66 is different than any of the values on connections 63–65, then the delay mechanism 51, in response to the feedback signal on connection 95, is designed to decrease the delay associated with the delay mechanism 51. For example, if the value on connection 63 is different than the values on connections 64–66, then the delay mechanism 51 in response to the feedback signal on connection 95 is preferably designed to decrease the delay associated with delay mechanism 51 by about 50 ps. If the values on connections 63 and 64 are different than the values on connections 65 and 66, then the delay mechanism 51 in response to the feedback signal on connection 95 is preferably designed to decrease the delay associated with delay mechanism 51 by about 100 ps. Furthermore, if the values on connections 63–65 are different than the value on connection 66, then the delay mechanism 51 in response to the feedback signal on connection 95 is preferably designed to decrease the delay associated with delay mechanism 51 by about 150 ps. If desired, the delay associated with delay mechanism 51 may be increased or decreased by different amounts in the foregoing examples to ensure reliable data on connection 66.

In addition, if the value on connection 66 is different than any of the values on connections 67–69, then the delay mechanism 51, in response to the feedback signal on connection 95, is designed to increase the delay associated with the delay mechanism 51. For example, if the value on connection 66 is different than the values on connections 67–69, then the delay mechanism 51 in response to the feedback signal on connection 95 is configured to increase the delay associated with delay mechanism 51 by about 150 ps. If the values on connections 66 and 67 are different than the values on connections 68 and 69, then the delay mechanism 51 in response to the feedback signal on connection 95 is designed to increase the delay associated with delay mechanism 51 by about 100 ps. Finally, if the values on connections 66–68 are different than the value on connection 69, then the delay mechanism 92 in response to the feedback signal on connection 95 is designed to increase the delay associated with delay mechanism 51 by about 50 ps. If desired, the delay associated with delay mechanism 51 may be increased or decreased by different amounts in the foregoing examples to ensure reliable data on connection 66.

Therefore, the feedback mechanism 92 is preferably designed to indicate via the feedback signal how much the delay associated with the delay mechanism 51 should be changed. In this regard, the feedback mechanism 92 is preferably designed to transmit a three bit feedback signal indicating whether the delay associated with delay mechanism should: (1) remain unchanged; (2) increase by 50 ps; (3) increase by 100 ps; (4) increase by 150 ps; (5) decrease by 50 ps; (6) decrease by 100 ps; or (7) decrease by 150 ps. It should be noted that the foregoing values are used for illustrative purposes only and that other values may be employed without departing from the principles of the present invention.

Alternatively, the feedback mechanism 92 can be configured to transmit a two bit signal indicating whether the delay of the delay mechanism 51 should remain unchanged, should be increased, or should be decreased. When the feedback signal indicates that the delay should be increased or decreased, the delay mechanism 51 is designed to respectively increase or decrease the delay by a predetermined amount. As a result, a state where the output (Q) of each latch 52–58 has the same value will eventually be reached.

It should be noted that the delay mechanism 51 should decrease its delay based on the feedback signal only when the latches 52–55 have been clocked by the same transition of the clock signal 12, and the delay mechanism 51 should increase its delay based on the feedback signal only when the latches 55–58 have been clocked by the same transition of the clock signal 12. Therefore, the enabling mechanism 97 is configured to transmit an enabling signal (e.g., a pulse) to delay mechanism 51 after a transition of the clock signal 12 has been received by each of the latches 52–58 and before the next transition of the clock signal 12 is received by any of the latches 52–58. Furthermore, in changing the delay of the delay mechanism 51, the delay mechanism 51 is designed to only utilize feedback signals received when an enabling signal is received from the enabling mechanism 97.

Figure 5:
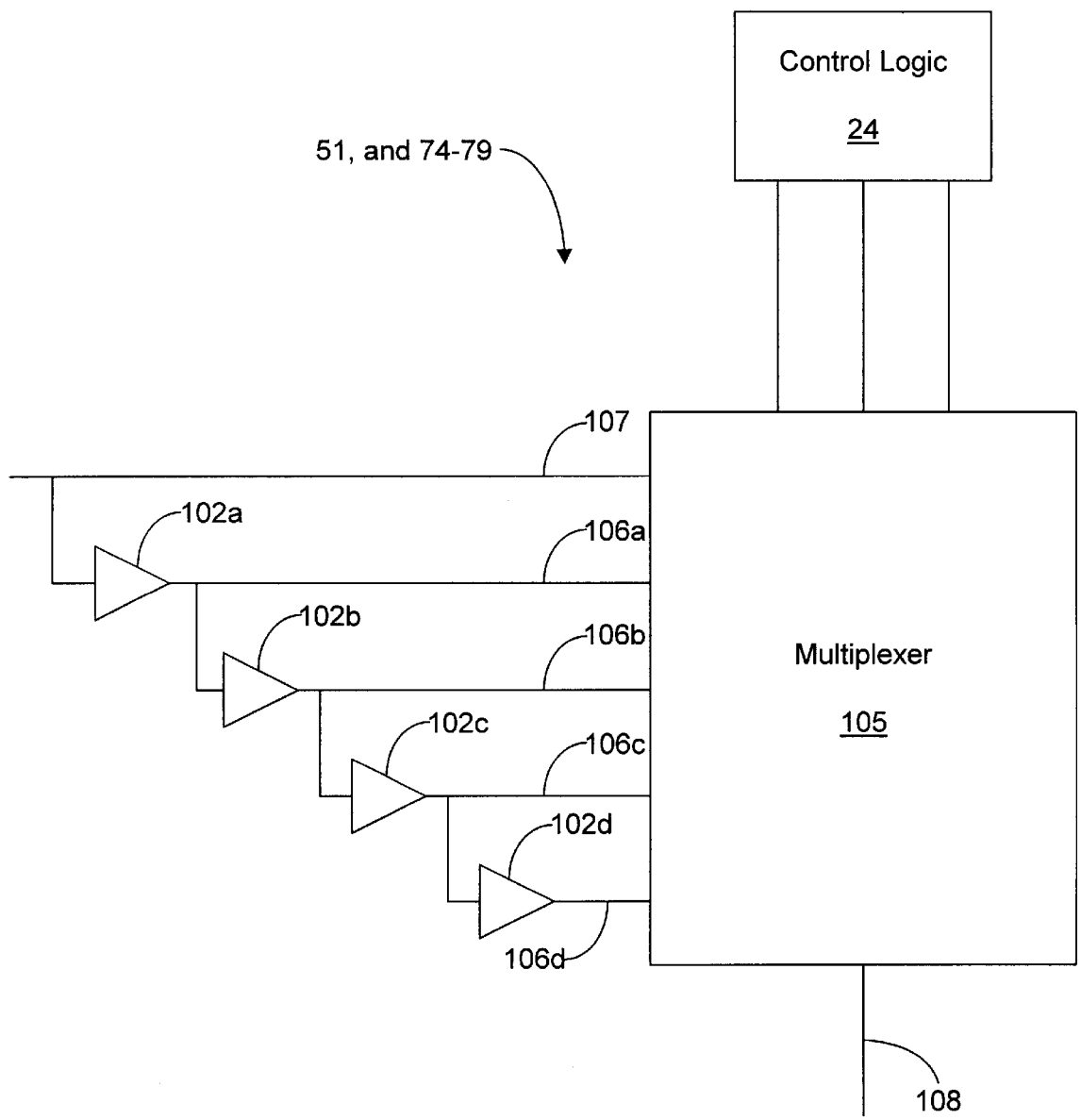
FIG. 5 is a block diagram illustrating an implementation of the delay mechanisms of FIG. 3.

Delay mechanisms 51 and 74–79 can be of any conventional design to achieve the functionality of delaying signals a desired amount of time. FIG. 5 depicts an example of a possible configuration of delay mechanisms 51 and 74–79. Each delay mechanism 51 and 74–79 is preferably configured to include a plurality of buffers 102a–102d coupled to a multiplexer 105 by a plurality of connections 106a–106d. Delay mechanisms 51 and 74–79 are designed to receive the signal 12 or 14 (FIGS. 1A and 1B) to be delayed on connection 107. The signals on connection 107 pass through each buffer 102a–102d to multiplexer 105. As known in the art, multiplexer 105 is of a conventional design which outputs one of the signals on connections 106a, 106b, 106c, 106d or 107 across an output connection 108.

Control logic 24 is designed to provide control signals to mulitplexer 105 to instruct multiplexer 105 on which connection 106a, 106b, 106c, 106d or 107 to select. As known in the art, each buffer 102a–102d delays a signal by a finite amount of time. Therefore, a signal on connection 107 is not delayed while signals on each connection 106a–106d are delayed an amount of time corresponding to a number of buffers 102a–102d that each of the signals respectively passes through. The more buffers 102a–102d that a signal passes through, the longer the signal is delayed. Therefore, the delay time of delay mechanism 51 and 74–79 can be altered by changing which connection 106a, 106b, 106c, 106d, or 107 provides the selected input to multiplexer 105.

Figure 6:
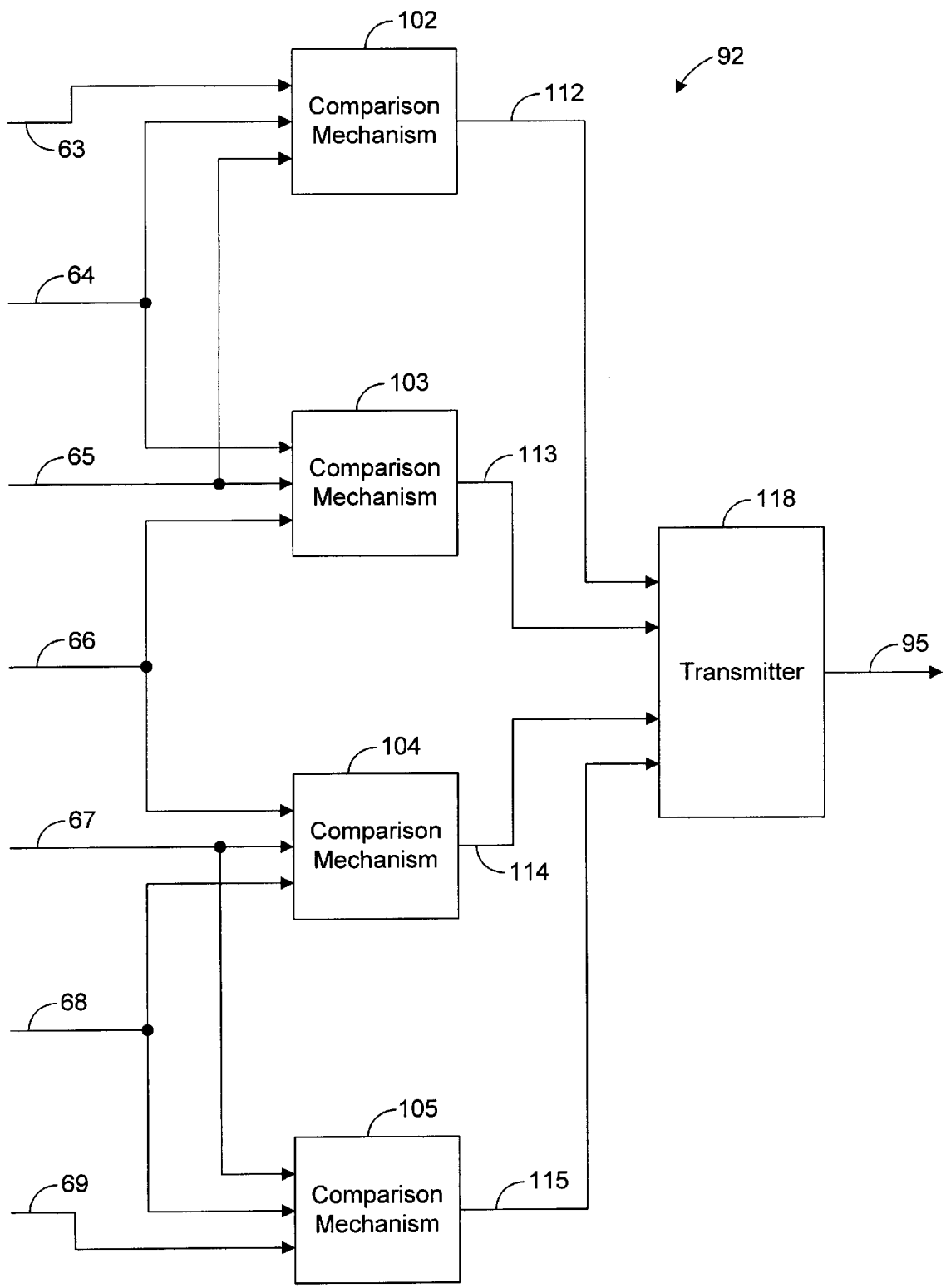
FIG. 6 is a block diagram illustrating an implementation of the feedback mechanism of FIG. 3.

Various implementations of the feedback mechanism 92 may exist without departing from the principles of the present invention. FIG. 6 shows an implementation of the preferred embodiment of the present invention. In this regard, each comparison mechanism 102–105 receives inputs from connections 63–69, as shown by FIG. 6. Furthermore, each comparison mechanism 102–105 transmits an output signal on connections 112–115, respectively. The output signal from each comparison mechanism 102–105 is asserted if all inputs to the comparison mechanism 102–105 have the same value, and the output signal from each comparison mechanism 102–105 is deasserted if any of the inputs to the comparison mechanism 102–105 are different.

Furthermore, a transmitter 118 is designed to receive the signals on connections 112–115 and to transmit a feedback signal on connection 95 based on the signals received from connections 112–115. The transmitter 118 of this embodiment is designed to transmit a feedback signal indicating that the delay of the delay mechanism 51 should be increased when (1) the signal on connection 115 is deasserted and the signal on connection 114 is asserted or (2) the signal on connection 114 is deasserted and the signal on connection 113 is asserted. In addition, the transmitter 118 is further designed to transmit a feedback signal indicating that the delay of the delay mechanism 51 should be decreased when (1) the signal on connection 115 is asserted and the signal on connection 114 is deasserted or (2) the signal on connection 114 is asserted and the signal on connection 113 is deasserted.

It should be noted that delay times other than those described hereinabove for delay mechanisms 51 and 74–79 may be employed without departing from the principles of the present invention. Furthermore, the number of latches 52–58 may be changed without departing from the principles of the present invention. However, to ensure that the transitions of the data signal on connection 62 received by the latch 55 do not occur within a predetermined time before transitions of the clock signal 12 received by the latch 55, there should be at least one latch 52, 53, or 54 that receives a transition of the clock signal 12 before the latch 55 receives the transition. In addition, to ensure that the transitions of the data signal on connection 62 received by the latch 55 do not occur within a predetermined time after transitions of the clock signal 12 received by the latch 55, there should be at least one latch 56, 57, or 58 that receives a transition of the clock signal 12 after the latch 55 receives the transition.

For example, latches 54–56 of the preferred embodiment can be utilized to determine whether a transition of the clock signal 12 received by latch 55 occurs within 50 ps (or some other amount) of a corresponding transition of the data signal on connection 62. In this regard, if a transition of the clock signal 12 is received by latch 55 within 1–50 ps after a corresponding transition of the data signal on connection 62, then the value transmitted on connection 66 by latch 54 should be different than the value transmitted on connection 66 by latch 55, once the transition of the clock signal 12 has propagated through each latch 54 and 55, as shown by FIG. 4C. If a transition of the clock signal 12 is received by latch 55 within 1–50 ps before a corresponding transition of the data signal on connection 62, then the value transmitted on connection 66 by latch 55 should be different than the value transmitted on connection 67 by latch 56, once the transition of the clock signal 12 has propagated through each latch 55 and 56, as shown by FIG. 4D. Furthermore, if a transition of the clock signal 12 is received by latch 55 more than 1–50 ps from a corresponding transition of the data signal on connection 62, then the values transmitted on connections 65–67 by latches 54–56 should be the same, once the transition of the clock signal 12 has propagated through each latch 54–56.

Consequently, in this example, the feedback mechanism 92 is designed to transmit a feedback signal on connection 95 indicating that the delay associated with delay mechanism 51 should be decreased by a desired amount, when the value of connection 65 is different than the value of connection 66. When the value of connection 66 is different than the value of connection 67, the feedback mechanism 92 is designed to transmit a feedback signal on connection 95 indicating that the delay associated with delay mechanism 51 should be increased by a desired amount. However, in other embodiments, the delay associated with delay mechanism can be differently adjusted without departing from the principles of the present invention.

It should be further noted that it may be possible control the delay of the clock signal 12 instead of the data signal 14 to adjust the timing of the data signal 14 with respect to the clock signal 12. In this regard, the delay mechanism 51 should be used to delay the clock signal 12 instead of the data signal 14. In this embodiment, the delay mechanism 51 should decrease the delay associated with the delay mechanism 51 when one of the connections 63–65 exhibits a different value than connection 66 (assuming an enabling signal from enabling mechanism 97 is present). Also, the delay mechanism 51 should increase the delay associated with the delay mechanism 51 when one of the connections 67–69 exhibits a different value than connection 66 (assuming an enabling signal from enabling mechanism 97 is present). However, it is possible to adjust the delay associated with delay mechanism 51 differently without departing from the principles of the present invention.

Furthermore, in some applications, it may not be desirable to adjust the delay associated with delay mechanism 51 each time the feedback signal on connection 95 indicates that the values of connections 63–69 are logically different when an enabling signal from enabling mechanism 97 is also present. For example, it may desirable to only correct for drift instead of jitter. Drift occurs when the timing difference between consecutive transitions of the data signal 14 and the clock signals 12 slowly increases or decreases, whereas jitter relates to momentary or abrupt changes in the timing of the clock signal 12 and the data signal 14. By requiring the feedback signals to indicate a need to adjust the delay of delay mechanism 51 for a predetermined time before adjusting the delay of the delay mechanism 51, it is possible to only correct for drift as opposed to jitter. However, in other applications, it may be desirable to adjust the delay of delay mechanism 51 each time the feedback signals indicate that the delay of delay mechanism 51 should be changed. Accordingly, various methodologies for analyzing the feedback signals to determine when to adjust the delay associated with delay mechanism 51 may be employed without departing from the principles of the present invention.

Operation

The preferred use and operation of the signal comparison system 20 and associated methodology are described hereafter.

Referring to FIG. 3, the delays associated with delay mechanisms 74–79 are initially set to a predetermined amount. The amount of delay associated with each delay mechanism can vary. However, the configuration of the system 20 is preferably such that at least one latch 52–54 receives a clock transition from clock signal 12 a predetermined amount of time before latch 55 receives the transition and that at least one latch 56–58 receives a clock transition from clock signal 12 a predetermined amount of time after latch 55 receives the transition. To ensure that timing errors associated with the data on connection 66 do not occur, the predetermined amount of time is chosen to correspond to at least the minimum amount of time that should elapse between a transition of the clock signal 12 and a transition of the data signal 14. In the preferred embodiment, it is assumed for illustrative purposes that the minimum amount of time is 150 ps.

After passing through the delay mechanism 51, the data signal 14 is transmitted to each latch 52–58 as input (D). Furthermore, the clock signal 12 is also transmitted to latches 52–58. Each latch 52–58 transmits the logical value of connection 62 across connections 63–69, respectively, when the latch 52–58 receives a clocking transition from the clock signal 12. As shown by FIG. 3, the clock transitions are delayed for different amounts of time so that each latch 52–58 latches the signal on connection 62 at different times.

Feedback mechanism 92 analyzes the signals on connections 63–69 to determine whether the delay associated with delay mechanism 51 should be changed. In this regard, if the value on all of the connections 63–69 are the same, then the amount of time between transitions of the clock signal 12 received by latch 55 and transitions of the data signal on connection 62 is large enough such that the delay associated with the delay mechanism 51 does not need to be changed to ensure reliable data on connection 66. However, if any one of the connections 63–69 has a value different than another one of the connections 63–69 (when an enabling signal from enabling mechanism 97 is present), then the delay associated with delay mechanism 51 should be changed to ensure reliable data on connection 66. In this regard, the feedback mechanism 92 transmits a feedback signal on connection 95 to indicate to the delay mechanism 51 that its delay should be changed.

In this regard, if any of the connections 63–65 exhibits a different data value than connection 66, then the feedback mechanism 92 transmits a feedback signal that causes the delay mechanism 51 to decrease its delay. However, if any of the connections 67–69 exhibits a different data value than connection 66, then the feedback mechanism 92 transmits a feedback signal that causes the delay mechanism 51 to increase its delay. In addition, when the values on connections 63–69 are all the same, the feedback mechanism 51 indicates that the delay of delay mechanism 51 should not be changed.

In the preferred embodiment, the delay associated with the delay mechanism 51 is only adjusted in response to a feedback signal received after a clock transition has been received by each of the latches 52–58 and before the next consecutive transition of clock signal 12 is received by any one of the latches 52–58. Therefore, the enabling mechanism 97 transmits an enabling signal indicating when the delay mechanism 51 may respond to a feedback signal. In this regard, the enabling mechanism 97 only transmits an enabling signal after a transition of the clock signal 12 has been received by each latch 52–58 and before the next transition of the clock signal 12 is received by any one of the latches 52–58. The delay mechanism 51 only responds to a feedback signal from feedback mechanism 92 when an enabling signal is also received from the enabling mechanism 97.

By changing the delay associated with delay mechanism 51 as described hereinabove, the number of transitions of the clock signal 12 received by latch 55 that occur within a predetermined amount of time relative to the transitions of the data signal 14 received by latch 55 are reduced. As a result, the reliability of the data transmitted across connection 66 is improved.

It should be noted that it is not necessary for the delay mechanisms 74–49 to be connected together as shown by FIG. 3. For example, it is possible for any or all of the delay mechanisms 74–79 to receive transitions that have not been delayed by any of the other delay mechanisms 74–79. However, it may be desirable to adjust the delay times described hereinbefore for the delay mechanisms 74–79 in order to account for the fact that each transition passes through fewer delay mechanisms 74–79 in such embodiments.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention.

Now, therefore, the following is claimed:

1. A system for reducing timing errors, comprising:
   a first latch configured to receive a data signal and a clock signal, said first latch configured to latch a value of said data signal in response to a transition of said clock signal;
   a second latch configured to receive said data signal and said clock signal, said second latch configured to latch a value of said data signal in response to said transition of said clock signal;
   a third latch configured to receive said data signal and said clock signal, said third latch configured to latch a value of said data signal in response to said transition of said clock signal;
   a first delay mechanism coupled to said first latch, said first delay mechanism configured to delay said transition before said transition is received by said first latch such that said first latch receives said transition after said third latch receives said transition;
   a second delay mechanism coupled to said second latch, said second delay mechanism configured to delay said transition before said transition is received by said second latch such that said second latch receives said transition after said first latch receives said transition; and
   a feedback mechanism configured to receive said latched values, said feedback mechanism configured to transmit a feedback signal based on said latched values, said feedback signal indicative of whether said first, second, and third latches latched the same logical value of said data signal in response to said transition.

2. The system of claim 1, further comprising a third delay mechanism configured to delay said data signal by a time period and to adjust said time period based on said feedback signal.

3. The system of claim 2, further comprising an enabling mechanism configured to determine whether said transition has been received by each of said latches and to enable said third delay mechanism to adjust said time period after said transition has been received by each of said latches and before a next transition of said clock signal has been received by any of said latches, said enabling mechanism further configured to disable said third delay mechanism from adjusting said time period after said transition has been received by one of said latches and until said transition has been received by each of said latches.

4. The system of claim 1 further comprising a third delay mechanism configured to delay said clock signal by a time period and to adjust said time period based on said feedback signal.

5. The system of claim 4, further comprising an enabling mechanism configured to determine whether said transition has been received by each of said latches and to enable said third delay mechanism to adjust said time period after said transition has been received by each of said latches and before a next transition of said clock signal has been received by any of said latches, said enabling mechanism further configured to disable said third delay mechanism from adjusting said time period after said transition has been received by one of said latches and until said transition has been received by each of said latches.

6. A system for correcting timing errors, comprising:

a first delay mechanism configured to delay a clock signal;

a second delay mechanism configured to delay said clock signal;

a connection for transmitting a data signal;

a first latch coupled to said connection, said first latch configured to receive a transition of said clock signal and to latch said data signal in response to said transition of said clock signal;

a second latch coupled to said first delay mechanism and to said connection, said second latch configured to receive said transition of said clock signal and to latch said data signal in response to said transition of said clock signal;

a third latch coupled to said second delay mechanism and to said connection, said third latch configured to receive said transition of said clock signal and to latch said data signal in response to said transition of said clock signal; and a feedback mechanism coupled to said first latch, said second latch, and said third latch, said feedback mechanism configured to transmit a feedback signal based on signals received from said first latch, said second latch, and said third latch, said feedback mechanism configured to indicate, via said feedback signal, whether any of said latches received a transition of said data signal after said first latch received said transition of said clock signal and before said third latch received said transition of said clock signal, wherein said delay mechanisms delay said clock signal such that said third latch receives each transition of said clock signal after said second latch receives said each transition of said clock signal.

7. The system of claim 6, wherein said feedback signal indicates whether said signals received from said first latch, said second latch, and said third latch are logically equivalent.

8. The system of claim 6, further comprising a third delay mechanism coupled to said connection and to said feedback mechanism, said third delay mechanism configured to delay said data signal based on said feedback signal.

9. The system of claim 6, further comprising an enabling mechanism configured to transmit an enabling signal to said third delay mechanism in response to a determination that said transition of said clock signal has been received by said first latch, said second latch, and said third latch.

10. The system of claim 6, further comprising a third delay mechanism coupled to said feedback mechanism, said third delay mechanism configured to delay said clock signal based on said based on said feedback signal.

11. The system of claim 10, further comprising an enabling mechanism configured to transmit an enabling signal to said third delay mechanism in response to a determination that said transition of said clock signal has been received by said first latch, said second latch, and said third latch.

12. A system for correcting timing errors, comprising:

means for receiving a data signal and a clock signal;

means for latching a value of said data signal in response to a transition of said clock signal;

means for latching a value of said data signal in response to said transition of said clock signal;

means for delaying said transition before said transition is received by one of said latching means;

means for comparing said values;

means for transmitting a feedback signal based on said values; and means for adjusting a delay of one of said signals received by said receiving means based on said feedback signal.

13. The system of claim 12, further comprising a means for enabling said adjusting means to adjust said delay after both of said latches receive said transition and before either of said latches receives a next transition of said clock signal.

14. The system of claim 13, wherein said enabling means is configured to disable said adjusting means after one of said latching means receives said transition until the other of said latching means receives said transition.

15. A method for correcting timing errors, comprising the steps of:

receiving a data signal and a clock signal;

latching a value of said data signal in response to a transition of said clock signal;

latching a value of said first signal in response to said transition of said clock signal;

delaying said transition between said latching steps;

comparing said values;

transmitting a feedback signal based on said values; and adjusting a delay of one of said signals received in said receiving step based on said feedback signal.

16. The method of claim 15, further comprising the step of enabling performance of said adjusting step subsequent to said latching steps.

17. The method of claim 16, further comprising the step of disabling performance of said adjusting step between said latching steps.

18. The method of claim 15, further comprising the step of indicating whether said values are logically equivalent via said feedback signal.

19. The system of claim 15, wherein said feedback signal is indicative of whether said data signal transitioned between said latching steps.

* * * * *